Oct. 20, 1953 M. SPARKS 2,656,496

SEMICONDUCTOR TRANSLATING DEVICE

Filed July 31, 1951

INVENTOR
M. SPARKS
BY
D. MacKenzie
AGENT

Patented Oct. 20, 1953

2,656,496

UNITED STATES PATENT OFFICE 2,656,496

SEMICONDUCTOR TRANSLATING DEVICE

Morgan Sparks, Basking Ridge, N. J., assignor to Bell Telephone Laboratories, Incorporated, New York, N. Y., a corporation of New York Application July 31, 1951, Serial No. 239,609

18 Claims. (Cl. 317—235)

This invention relates to improvements in semiconductor elements, such as germanium and silicon, for signal translating devices such as disclosed in the application Serial No. 35,423, filed June 26, 1948, by W. Shockley, now Patent 2,569,347, and has the general object of facilitating the connection of such devices in electrical circuits.

This application is a continuation-in-part of my copending application Serial No. 168,183, filed June 15, 1950.

The invention includes a method of making readily detectable the junction or junctions, between two regions of opposite conductivity type in a single crystal of semiconductor material, for example, germanium, and comprises the step of electrolytically producing in such a crystal a transverse enlargement of the region of one conductivity type relatively to the region of the opposite conductivity type. Such a semiconductor may be made in the manner disclosed in the application of G. K. Teal, Serial No. 168,184, filed June 15, 1950. When a p-n junction is biased in the reverse direction, there is a sharp voltage gradient at the junction, and it is possible to dissolve electrolytically germanium from the surface of the n-type side of the junction before the potential difference between the p-type side and the electrolyte is great enough to dissolve germanium from the p-type surface. Conversely, if the p-n junction is biased in the forward direction, it is found possible to dissolve the germaninm preferentially from the p-type surface. In the two cases the current density should be approximately the same, so that a lower voltage suffices for the second case. In other words the positive voltage applied to the region to be etched is sufficient to produce a current density necessary for electrolytic etching of that region. Moreover, the voltage drop is such that the current density in the other region is insufficient to cause appreciable etching. As previously indicated, the noted voltage drop in the crystal is chiefly across the relatively high resistance barrier between the n-type and p-type regions.

Another general object of the invention is to produce a semiconductor element comprising adjacent regions of opposite conductivity type in which the region of one conductivity type is distinguished from an adjacent region of the opposite type by a shoulder at the junction of the two regions.

This result can be accomplished by the use of either direct or alternating current in electrolytes of various compositions.

The invention will be fully understood from the following description of an illustrative embodiment thereof with reference to the accompanying drawings, in which.

Figure 1:
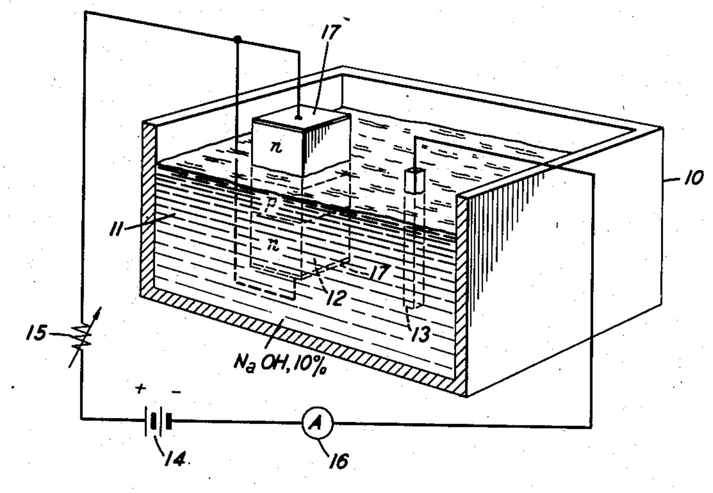
Fig. 1 shows an electrolysis bath suitable for use in practicing the invention.

Referring to Fig. 1, 10 designates a vessel, say of glass, containing a 10 per cent solution 11 of sodium hydroxide. Immersed in this solution are the anode and cathode electrodes 12 and 13 connected respectively to the positive and negative terminals of battery 14 in series with variable resistance 15 and ammeter 16. The ohmic contacts 17, 17 plated on the n-type ends of anode 12 are connected jointly to the positive battery terminal.

Anode 12 is a block of semiconductor material, germanium for example, comprising two regions of n-type conductivity between which is a region of p-type conductivity. The several regions are identified by the letters "n" and "p" respectively. Cathode 13 may be of graphite or of any conducting material inert to the electrolyte.

The current from battery 14 is adjusted to a value less than great enough to liberate oxygen at the anode, and electrolysis is continued until a satisfactory transverse enlargement appears over the p-type region from which germanium is removed less rapidly than from the adjacent n-type regions. Of course there may be but one n-type region adjoining and continuous with the p-type region in which case a positive battery connection to only one contact 17 is needed.

In the process, hydrogen is liberated at cathode 13, while at anode 12 the germanium is oxidized to a germanium ion which forms germanium salts in the electrolyte. Any electrolyte may be used in which germanium does not form insoluble salts; examples are sodium chloride, sodium nitrite, hydrochloric acid, etc. Wax or another non-conductor may be used to insulate the contacts and leads to the germanium from the electrolyte.

Figure 2:
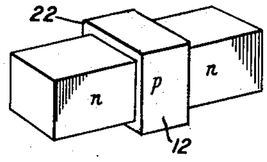
Fig. 2 is a perspective view of a semiconductor element produced in accordance with the invention and comprising a p-type region between two n-type regions.

The result of the differential electrolysis abovedescribed is shown in Fig. 2. Here the germanium block 12, shown to a larger scale than in Fig. 1, exhibits the p-type portion differentiated from the adjacent n-type portions by a shelf 22, the removal of germanium having progressed more slowly over this part of the block.

Shelf 22 affords an easy identification of the p-type region, and an ohmic contact can with no uncertainty be attached without electrical search.

While germanium has been selected for illustration of the invention, the method is equally applicable to silicon for the like purpose.

Figure 3:
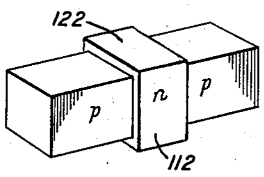
Fig. 3 is a perspective view of a like semiconductor element in which an n-type region is between two p-type regions.

In Fig. 3, the semiconductor element 112 is again germanium, for illustration only, and is prepared in an electrolysis bath similar to that shown in Fig. 1, but in the element treated an n-type region is located between two p-type regions. The circuit connections are the same, namely, the positive battery terminal being applied to the end regions of the specimen; the p-n junctions are now biased in the forward direction and a greater resistance is included in series with the battery. As before, resistance 15 is adjusted to keep the current less than great enough to liberate oxygen at the anode. Shelf 122 is now formed over the n-type region.

Figure 4:
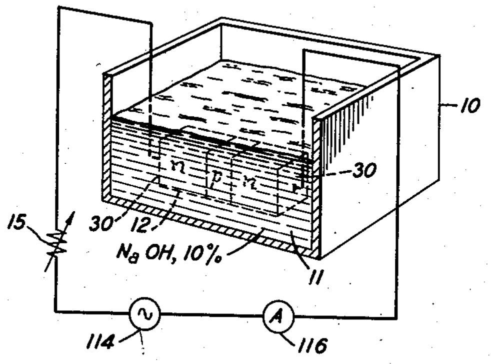
Fig. 4 shows a modification of the arrangement of Fig. 1, in which alternating current is used.

In Fig. 4 bath 11 is the same as in Fig. 1, but anode 12, an n-p-n block in Fig. 1, is connected at ohmic contacts 30, 31 with the terminals of an alternating current source 114, suitably 60 cycles, in series with resistor 15 and alternating current ammeter 116. It will be noted that cathode 13 of Fig. 1 is absent; contacts 30 and 31 are alternately positive and negative to the solution in successive half-cycles of the current from source 114. The insulation of contacts and leads is the same as in the circuit of Fig. 1.

The operation of the apparatus shown in Fig. 4 is as follows:

In one-half of the current cycle one of the two n-type regions is positive with respect to the solution and dissolves electrochemically. The p-type region and the other n-type region are both negative to the solution and act as the inert electrode 13 of Fig. 1; the succeeding half cycle makes the other n-type region positive to the solution. Thus electrochemical solution takes place alternately over the n-type surfaces and the treatment is contained until the p-type shelf is suitably prominent.

In each half cycle, hydrogen is liberated at the p-type surface and at whichever of the n-type surfaces is negative to the solution.

If an etching solution is used as the electrolye in place of the solutions already named as suitable for the electrolytic differentiation of p- and n-type regions, it is possible to produce a similar discrimination together with etching to secure freshly cleaned and crack-free surfaces.

Figure 5:
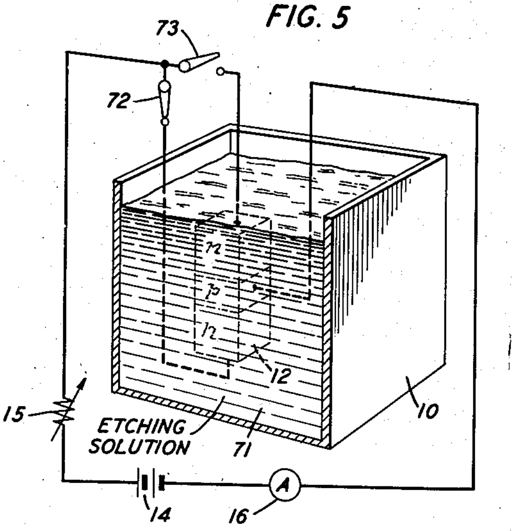
Fig. 5 shows another modification of Fig. 1.

Fig. 5 illustrates the procedure. Electrolyte 71 is an etching solution, suitably composed (for a volume of 400 milliliters) as follows:

| | Milliliters |
|---|---|
| Hydrofluoric acid, 48% | 100 |
| Glacial acetic acid | 100 |
| Nitric acid, concentrated | 200 |
| Bromine | 0.3 |

Such a solution readily dissolves germanium and silicon, and the rate of solution can be increased by applying a positive voltage to the immersed semiconductor.

Switches 72 and 73 permit application of the positive lead from battery 14 to either or both the n-type portions of element 12, while the p-type portion is connected to the negative battery lead. It is to be understood that the battery connections may be reversed if desired to enhance the n-type surfaces by accelerating the solution of the p-type, and that element 12 may be p-n-p, or simply p-n, as well as n-p-n.

What is claimed is:

1. The method of differentially removing material from regions of one and of the opposite conductivity type in an element of semiconductor material which comprises immersing the element in an electrolytic bath and applying to the regions of one conductivity type a voltage positive to the path, thereby preferentially removing material from the regions of the one type.

2. The method of claim 1 in which the applied voltage is unidirectional.

3. The method of relatively enlarging a layer of semiconductor material of one conductivity type intermediate layers of the opposite conductivity type which comprises immersing the material in an electrolytic bath and applying to the layers of the opposite type a voltage positive to the bath.

4. The method of claim 2 in which the bath contains an inert electrode as cathode and a direct current is established in the bath in the direction from the immersed material to the cathode.

5. The method of claim 2 in which the bath is an etchant for the material.

6. The method of relatively enlarging in a semiconductor element a region of material of one conductivity type intermediate terminal regions of the opposite type which comprises immersing the element in an etchant electrolyte and applying an alternating voltage between the intermediate region and at least one of the terminal regions.

7. A semiconductor translating device comprising adjoining regions of opposite electrical conductivity types in which the surface of the regions of one type is elevated above the surfaces of the regions of the opposite type.

8. A semiconductor translating device as in claim 7 in which the elevated surface is of a region of n-type conductivity.

9. A semiconductor element containing a region of one type of electrical conductivity adjoined on each side by a region of the opposite conductivity type in which the first named region is transversely enlarged relatively to the adjoining regions.

10. A semiconductor element as in claim 9 in which the adjoining regions are of p-type conductivity.

11. The method of relatively enlarging a layer of p-type semiconductor material intermediate layers of n-type material which comprises the steps of immersing the material in an electrolytic bath and applying to the immersed n-type material only a continuous voltage positive to the bath.

12. The method of claim 11 wherein the material is germanium.

13. The method of claim 11 wherein the material is silicon.

14. The method of making visibly prominent the p-type region adjacent an n-type region in a p-n junction of semiconductor material by selective dissolving of said material in an electrolyte which comprises the step of differentially removing material from the two regions by maintaining on one region a higher positive voltage with respect to the electrolyte than is maintained on the other region.

15. An n-p-n junction in semiconductor material in which the cross sections of the n-type portions are each smaller than the cross section of the p-type portion.

16. A semiconductor signal translating device comprising a junction between adjoining regions of material of p-type and of n-type electrical conductivity in which in the plane of the junction the perimeter of the p-type material exceeds that of the n-type material all portions of the p-type perimeter being outside of the n-type perimeter.

17. A p-n junction in semiconductor material in which in the plane of the junction the cross section of the p-type material exceeds that of the n-type material extending beyond said n-type material in all directions within said plane.

18. A body of semiconductor material having adjacent regions of n-type and of p-type conductivity separated by a junction in which all of the surfaces of the p-type region adjacent to the junction are raised above the corresponding surfaces of the n-type region forming a continuous shelf around the body at the junction.

MORGAN SPARKS.

References Cited in the file of this patent

UNITED STATES PATENTS

| Number | Name | Date |
|---|---|---|
| 2,447,829 | Whaley | Aug. 24, 1948 |
| 2,560,594 | Pearson | July 17, 1951 |
| 2,561,411 | Pfann | July 24, 1951 |
| 2,600,500 | Haynes et al. | June 17, 1952 |